US011218401B2

(12) United States Patent
Webster et al.

(10) Patent No.: US 11,218,401 B2
(45) Date of Patent: Jan. 4, 2022

(54) COMPUTER NETWORK DEVICE, A COMPUTER INTERNETWORK AND A METHOD FOR COMPUTER NETWORKING (71) Applicant: Arista Networks, Inc., Santa Clara, CA (US)

(72) Inventors: Alexander Peter Webster, Sydney (AU); Anant Jain, Sydney (AU)

(73) Assignee: Arista Networks, Inc., Santa Clara, CA (US)

(*) Notice: Subject to any disclaimer, the term of this patent is extended or adjusted under 35 U.S.C. 154(b) by 32 days.

(21) Appl. No.: 16/637,816

(22) PCT Filed: Aug. 9, 2018

(86) PCT No.: PCT/AU2018/050842
§ 371 (c)(1),
(2) Date: Feb. 10, 2020

(87) PCT Pub. No.: WO2019/028521
PCT Pub. Date: Feb. 14, 2019

(65) Prior Publication Data
US 2020/0244567 A1    Jul. 30, 2020

(30) Foreign Application Priority Data
Aug. 10, 2017  (AU) ................................ 2017903200

(51) Int. Cl.
*H04L 12/931* (2013.01)
*H04L 12/937* (2013.01)
(Continued)

(52) U.S. Cl.
CPC .............. *H04L 45/04* (2013.01); *G06F 30/34* (2020.01); *H04L 45/02* (2013.01); *H04L 45/16* (2013.01); *H04L 69/322* (2013.01)

(58) Field of Classification Search
None
See application file for complete search history.

(56) References Cited

U.S. PATENT DOCUMENTS 5,453,978 A    9/1995 Sethu et al.
9,104,458 B1   8/2015 Brandwine et al.
(Continued)

FOREIGN PATENT DOCUMENTS

WO    WO2017097562 A1    6/2017

OTHER PUBLICATIONS

International Search Report and Written Opinion issued in corresponding Application No. PCT/AU2018/050842, dated Oct. 15, 2018 (11 pages).

*Primary Examiner* — Ajit Patel
(74) *Attorney, Agent, or Firm* — Chamberlain, Hrdlicka, White, Williams & Aughtry (57) ABSTRACT

A computer network device that includes a plurality of computer network ports for connecting to a plurality of computer network nodes is disclosed. The computer network device includes switching circuitry that communicates each of a plurality of messages received by more than one of the plurality of computer network ports to at least one other computer network port for transmission. The computer network device also includes a management processor that includes a plurality of management processor communication ports that include at least one externally accessible communication port and at least one externally inaccessible communication port. The at least one externally inaccessible communication port is in communication with the switching circuitry, and the management processor sends switching circuitry configuration instructions via the at least one externally inaccessible communication port to configure the switching circuitry.

20 Claims, 3 Drawing Sheets

(51) Int. Cl.
*H04L 12/715* (2013.01)
*G06F 30/34* (2020.01)
*H04L 12/751* (2013.01)
*H04L 12/761* (2013.01)
*H04L 29/08* (2006.01)

(56) References Cited

U.S. PATENT DOCUMENTS

| | | |
|---|---|---|
| 9,386,001 B1 | 7/2016 | Marquardt et al. |
| 2007/0097974 A1 | 5/2007 | Ward et al. |
| 2008/0044181 A1* | 2/2008 | Sindhu ............... H04J 14/0267 398/49 |
| 2009/0003375 A1* | 1/2009 | Havemann .............. H04L 45/60 370/463 |
| 2013/0223442 A1* | 8/2013 | Narayanan .............. H04L 49/25 370/389 |
| 2016/0007102 A1* | 1/2016 | Raza .................... H04L 49/356 398/45 |
| 2017/0111295 A1* | 4/2017 | Snowdon ................ G06F 13/00 |
| 2017/0142031 A1 | 5/2017 | Mackie et al. |

\* cited by examiner

COMPUTER NETWORK DEVICE, A COMPUTER INTERNETWORK AND A METHOD FOR COMPUTER NETWORKING

TECHNICAL FIELD

The disclosure herein generally relates to a computer network device, a computer internetwork and a method for computer networking.

BACKGROUND

Figure 1:
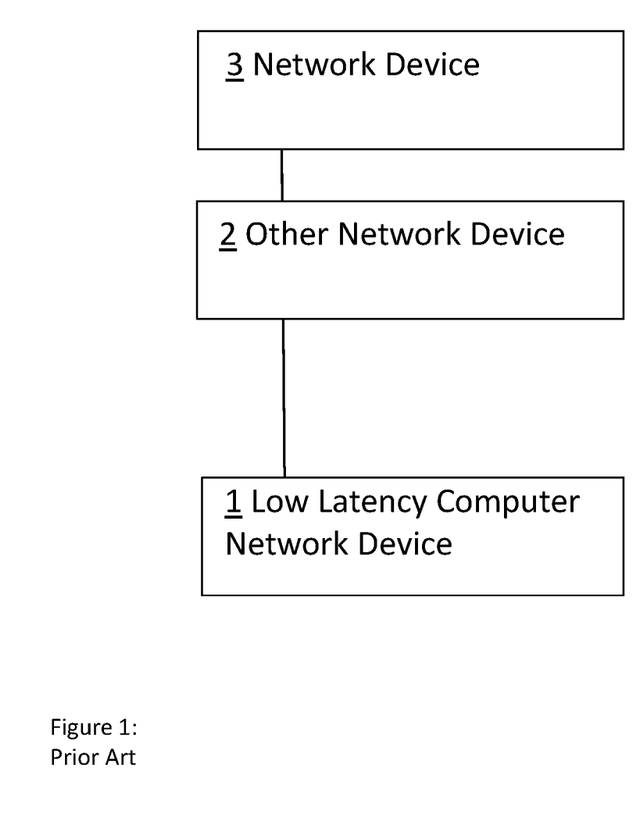
FIG. 1 is a schematic diagram of an example prior art network device.

Computer networking devices may generate layer 3 protocol data units (PDUs), border gateway protocol (BGP) messages and protocol independent multicasting (PIM) messages. BGP is a standardised exterior gateway protocol for exchanging routing and reachability information. It is used on internetworks, between routers on the internet for example. BGP makes routing decision based on paths, network policies. A PIM protocol is a multicast routing protocols for Internet Protocol (IP) networks that provide one-to-many and many-to-many distribution of data over a LAN, WAN or internetwork. Some computer networking devices, however, may omit layer 3, BGP, and PIM messages to reduce the period for the messages to pass therethrough (i.e. lower latency). Low latency computer networking switches devices may not be used by themselves. FIG. 1 is a schematic diagram of showing a prior art low latency computer networking device 1 in communication with a prior art example of another computer networking device 3. Yet another computer networking device 2 is in intermediate communication with the low latency computer networking device 1 and the other computer networking device 3. The yet other network device 2 is configured to send layer 3 PDU's, PBP messages, and PIM messages required by networking device 3 but not generally generated by low latency computer networking device 1.

The yet other network device 2 may be more expensive than desired, may increase management overhead, and may take space in an already tight space that may be otherwise utilised.

SUMMARY

Disclosed herein is a computer network device. The computer network device comprises a plurality of computer network ports for connecting to a plurality of computer network nodes. The computer network device comprises switching circuitry configurable to communicate each of a plurality of messages received by more than one of the plurality of computer network ports to at least one other computer network port for transmission. The computer network device comprises a management processor comprising a plurality of management processor communication ports comprising at least one externally accessible communication port and at least one externally inaccessible communication port, the at least one externally inaccessible communication port being in communication with the switching circuitry. The management processor is configured to send switching circuitry configuration instructions via the at least one externally inaccessible communication port to configure the switching circuitry. The management processor is configured run a container isolating the at least one externally inaccessible communication port such that when so isolated the at least one externally inaccessible port is not accessible by a computer process running within the management processor but outside of the container.

In the context of the present document, an externally accessible communications port is one that is accessible from outside of the computer network device. Examples of externally accessible communication ports include but are not limited to each of the plurality of outwardly orientated RJ45 sockets of a computer network switch that are disposed within a plurality of apertures through the computer network switch's case. The plurality of apertures may be, for example, through a panel, for example a front panel, of the case. In the context of the present document, an externally inaccessible communication port is a port that is not accessible from outside of the computer network device, for example a communication port that is internal of the computer network device, which may be only accessed by, for example, a technician using a tool to open the case. The internal communications port may not be configured to receive a connectorised end of a network cable, and so may also not be accessible for that reason.

A container is, in the context of this document, an operating-system level user-space instance. Computer processes can be run in the container and when so run are isolated from at least some other computer processes running on the management processor outside of the container, for example in another container. In the LINUX operating systems, a container may be, for example, a LXC container, an Open VZ container, or a LINUX-VServer container. Other operating systems may be used, which may have a form a container that may be used.

In an embodiment, the at least one externally accessible communication port is for receiving configuration instructions that instruct the management processor to send the switching circuitry configuration instructions.

In an embodiment, the management processor is configured to run at least one computer networking process within the container.

In an embodiment, the at least one computer networking process, when running, sends via the at least one externally inaccessible port a plurality of network control messages for transmission by the at least one other computer network port. The plurality of network control messages may comprise at least one of a plurality of layer 3 PDUs, a plurality of BGP control messages, and a plurality of protocol independent multicast (PIM) messages. The computer networking process may comprise at least one of a QUAGGA process and a process having a QUAGGA process functionality.

In an embodiment, the management processor is external of the switching circuitry. The switching circuitry may comprise a crosspoint switch. The crosspoint switch may be in intermediate communication with the plurality of computer network ports and the at least one other computer network port. The switching circuitry comprises a logic device in communication with the crosspoint switch. The logic device may comprise a field programmable gate array (FPGA).

In an embodiment, the switching circuity is not configured to generate at least one of a layer 3 PDU, a BGP message, and a PIM message.

Disclosed herein is a computer network device. The computer network device comprises a plurality of computer network ports for connecting to a plurality of computer network nodes. The computer network device comprises switching circuitry configurable to communicate each of a plurality of messages received by more than one of the plurality of computer network ports to at least one other computer network port for transmission. The computer network device comprises a management processor comprising a plurality of management processor communication ports comprising at least one externally accessible communication port and at least one externally inaccessible communication port, the at least one externally inaccessible communication port being in communication with the switching circuitry and the at least one externally accessible communication port is for receiving configuration instructions that instruct the management processor to send the switching circuitry configuration instructions. The management processor is configured to send switching circuitry configuration instructions via the at least one externally inaccessible communication port to configure the switching circuitry. The management processor is configured to run a container running a computer networking process therein, the container isolating the at least one externally inaccessible communication port such that when so isolated the at least one externally inaccessible port is not accessible by a computer process running within the management processor but outside of the container, wherein the computer networking process is configured to send via the at least one externally inaccessible port and the switching circuitry a plurality of network control messages, the switching circuitry being configured to communicate the plurality of network control messages to the at least one other computer network port for transmission.

Disclosed herein is a computer internetwork. The computer internetwork comprises a computer network device in accordance with the above disclosure. The computer network device comprises a plurality of computer network nodes in communication with the plurality of computer network ports of the computer network device. The computer internetwork comprises a computer network router in intermediate communication with the at least one other computer network port of the computer network device and a matching engine that is a node of an electronic market computer network.

In an embodiment, the plurality of computer network nodes are configured to generate financial instrument orders for the matching engine.

In an embodiment, it is required that the computer network device when operational generates at least one of a BGP message and PIM message.

Disclosed herein is a method for computer networking comprising. The method comprises instructing a management processor of a computer network device to run a container that isolates a container isolating at least one externally inaccessible communications port thereof that is in communication with switching circuitry of the computer network device, such that the at least one externally inaccessible communications port is not accessible by a computer process running within the management processor but outside of the container. The method comprises the management processor sending via the at least one externally inaccessible communications port switching circuitry configuration instructions to configure the switching circuitry to communicate each of a plurality of messages from a plurality of computer network ports of the computer network device to at least one other computer network port for transmission.

An embodiment comprises the step of running within the container a computer networking process that sends via the at least one externally inaccessible communication port switching circuitry network control messages for transmission by the at least one computer network port. The network control messages may comprise at least one of a plurality of layer 3 protocol data units (PDUs), a plurality of BGP control messages, and a plurality of PIM messages. The computer networking process may comprise at least one of a QUAGGA process and a process having a QUAGGA process functionality.

In an embodiment, the switching circuitry comprises a cross point switch. The management processor may be external of the cross point switch.

An embodiment comprises instructing the management processor to configure a crosspoint switch, which is in intermediate communication with the plurality of computer network ports.

In an embodiment, the management processor configures a logic device of the switching circuitry to process the plurality of messages.

In an embodiment, the switching circuity is not configured to generate at least one of a layer 3 PDU, a BGP message, and a PIM message.

Non-transitory processor readable tangible media including program instructions which when executed by a processor causes the processor to perform a method defined by any one of the claims 16 to 24.

A computer program for instructing a processor, which when executed by the processor causes the processor to perform a method defined by any one of the claims 16 to 24.

Disclosed herein is non-transitory processor readable tangible media including program instructions which when executed by a processor causes the processor to perform a method disclosed above.

Disclosed herein is a computer program for instructing a processor, which when executed by the processor causes the processor to perform a method disclosed above.

Any of the various features of each of the above disclosures, and of the various features of the embodiments described below, can be combined as suitable and desired.

BRIEF DESCRIPTION OF THE FIGURES

Embodiments will now be described by way of example only with reference to the accompanying figures in which.

DESCRIPTION OF EMBODIMENTS

Figure 2:
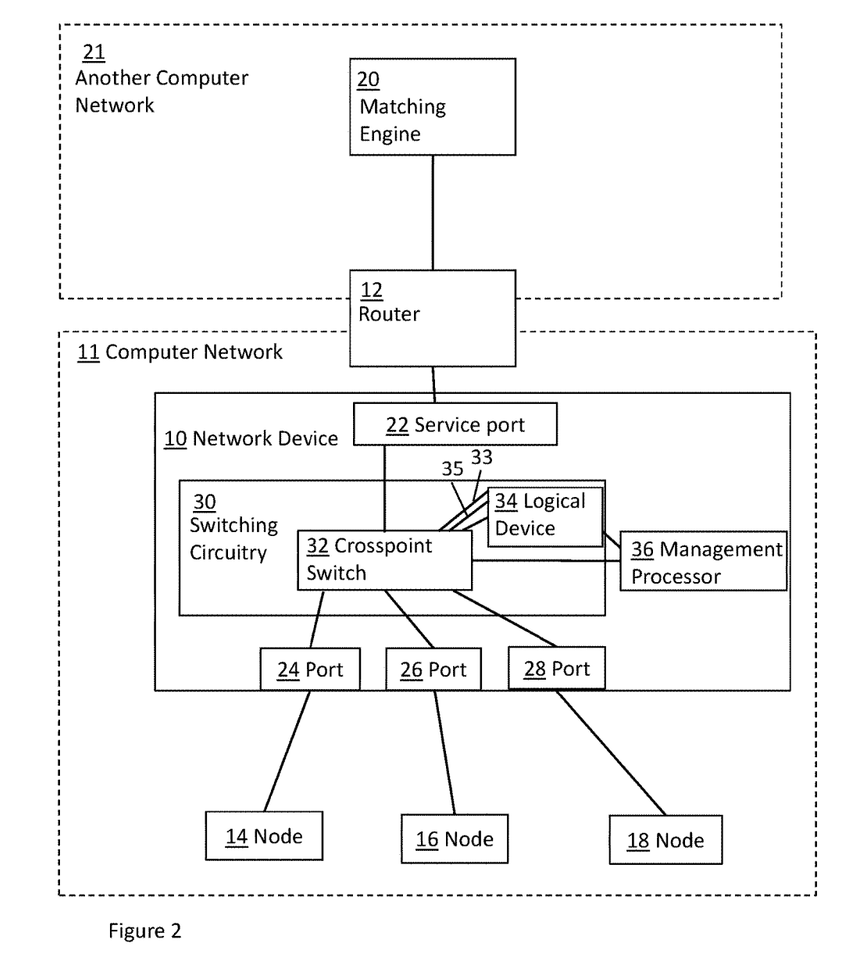
FIG. 2 shows a schematic diagram of an embodiment of a computer network device within a computer network.

FIG. 2 shows a diagram of an embodiment of computer network device, generally indicated by the numeral 10, within a computer network 11 in the form of an Ethernet computer network. The computer network device 10 has plurality of network medium attachments in the form of a plurality of computer network ports 24, 26, 28 for connecting to a plurality of computer network nodes 14, 16, 18. The plurality of computer network ports 22, 24, 26 and 28 are, in this but not embodiments, ports at a front panel of the computer network device 10, however they may be at a back panel or elsewhere.

The computer network device 10 comprises communications switching circuitry 30 configurable to communicate each of a plurality of messages when so received by more than one of the plurality of computer network ports 24, 26, 28 to at least one other computer network port 22, which is also in this but not all embodiments at the front panel. The messages are in this but not all embodiments in the form of Ethernet packet comprising financial instrument order information. The switching circuity 30 comprises, in this but not all embodiments, a crosspoint switch 32 in the form of a crosspoint switch integrated circuit. The crosspoint switch integrated circuit is a digital crosspoint switch integrated circuit, but in an otherwise identical embodiment it is an analogue crosspoint switch integrated circuit. The cross point switch 32 is in intermediate communication with the plurality of computer network ports 22-28. That is, the crosspoint switch 32 is reconfigurable to connect any port of the plurality of ports and the other port 22-28 to any other port of the plurality of ports and other port 22-28, which includes connecting one or many ports to one other port or many other ports. In one of many possible configurations of the computer network device 10, the switching circuitry is configured to connect each of the plurality of computer network ports 24,26, 28 to the other computer network port 22. In this configuration, the switching circuitry 30 is configured to multiplex a plurality of messages received at the plurality of computer network ports 24-28 to the at least one other computer network port 22. The ports 22-28 are, in this but not necessarily all embodiments, in the form of Ethernet ports, however they may comprise generally any suitable form of port, for example Infiniband ports.

The network circuitry 30 comprises an optional logic device 34 in the form of a field programmable gate array (FPGA). The FPGA 34 is in communication with the crosspoint switch 32. A message received on one of the plurality of computer network ports 24-28 can be sent by the crosspoint switch 32 through data conduit 33, for example, to the logic device 34. The logic device 34 applies a logic function to the message. If the logic function is a filter function and the message is filtered, then it is not sent back to the crosspoint switch 32, otherwise it is sent back to the crosspoint switch 32 through data conduit 35, for example. The crosspoint switch 32 sends the message received through data conduit 35 to the other computer network port 22 for transmission. The logic function may be time stamping of the message, or generally any suitable logic function.

The computer network device 10 is a low latency computer network device. The latency is less than 110 ns between any one of the plurality of computer network ports 24, 26, 28 and the at least one other computer network port 22 when multiplexing the plurality of messages, may be 65 ns in some embodiments. Generally, the multiplexing latency is 65 ns-110 ns, however it may be greater than or less than this is some embodiments.

The computer network device 10 comprises a management processor 36. The management processor 36 has a plurality of communication ports 123, 124, 125, 126 in the form of a plurality of management processor communication ports. At least one port 123, 124 of the plurality of management processor ports 123,124,125 is an externally accessible port and can be used to receive configuration instructions that instruct the management processor to configure the computer network device 10, for example configure the switching circuitry. The configuration instructions comprise at least one of FPGA configuration instructions and crosspoint switch configuration instructions. Communication conduit 113 in the form of a serial communication conduit is for communicating configuration instructions (which may be reconfiguration instructions) to the FPGA 34. Communications conduit 117 in the form of another serial communication conduit is for communicating configuration instruction to the crosspoint switch 32. Communication conduits 113 and 117 may be the same communication conduit. The configuration instructions may, for example, instruct the management processor to reconfigure the crosspoint switch 32 so that a plurality of communication pathways between a plurality of crosspoint switch ports are broken and/or made.

Computer network device configuration commands may be sent via a command line interface on another computer. The computer network device configuration commands may be received by one of the externally accessible ports 123, 124. The at least one externally accessible port 123, 124 may not be in communication with the switching circuitry 30. At least one other port 125, 126 of the plurality of management processor ports 123, 124, 125, 126 is in communication with the switching circuitry. Unless special steps are taken, the management processor 36 may receive information on an externally accessible port 123, 124 and, if so undesirably configured, pass that information to the cross point switch 30 for sending the information to the service port 22. This is not a desirable outcome and may be a security issue. A malicious service may exploit this. A service engineer may inadvertently send information via an externally accessible management port 123, 124 to the service port 22 via ports 125, 126.

In the present but not all embodiments, the at least one other computer network port 22 is in communication with a networking device in the form of a computer network router 12. The computer network router is a computer network edge router. The computer network router 12 is, in this but not all examples, in communication with a trade matching engine 20 within another computer network 21, which is a computer network of an electronic market. The plurality of messages from the plurality of clients 14, 16, 18 comprise electronic orders for the trading engine 20, which are sent via the computer network device 10 and computer network router 12.

Electronic markets, for example the NASDAQ Stock Market, the New York Stock Exchange (NYSE) and the Australian Securities Exchange (ASX) have a trade matching engine that includes for each financial instrument traded on the market an electronic order book for recording pending orders. Examples of financial instruments include but are not limited to shares, bonds, derivatives, commodities, and futures. The electronic order may be, for example, to buy or sell at least one financial instrument when a predefined price condition is met.

The computer network device 10 is configured to reduce the period for messages to pass therethrough by omitting services. Computer network device 10 is a low latency computer network device, however not all embodiments are low latency computer network devices. For example:

The switching circuitry 30 may not be able to generate layer 3 PDUs in the form of interne protocol (IP) packets.

The switching circuitry 30 may not be able to generate at least one of BGP messages (for routing) and PIM messages (for multicasting).

The switching circuitry 30 may omit generally any other service that is generally provided by a network switch, which may increase latency.

Another embodiment may may be configured to provide at least one of the above listed services, and/or omit other services that are not listed above.

BGP messages may comprise information indicating that a device that sent the BGP messages is a network device that can send and receive layer 3 packets (for example, IP packets), and also indicating which networks are connected to the device. The BGP messages are used by other networking devices.

The electronic market, however, specifies that the proximal network device to network 21—in this example the computer network device 10—must support at least one of BGP, PIM and layer 3 protocol data units ("exchange technical rules"). The computer network router 12 is configured to operate in accordance with a network protocol that requires the computer network device 10 generate layer 3 protocol data units.

The normal expected behaviour of a networking device is that a management interface 123, 124 is isolated from each of the computer network ports 22-28. Any traffic on a management interface 123, 124 should not interfere with traffic on any of the computer network ports 22-28, and vice versa.

The Linux kernel provides the cgroups functionality that allows limitation and prioritization of resources (CPU, memory, block I/O, network, etc.) without the need for starting any virtual machines, and also namespace isolation functionality that allows complete isolation of an applications' view of the operating environment, including process trees, networking, user IDs and mounted file systems. LXC combines the kernel's cgroups and support for isolated namespaces to provide an isolated environment for applications.

BitBake may be used to compile containers natively at build time. The code is prepared on a build server and then packages an image from the code, which is sent to the management processer 36 ready to run on the device 10. An operating system image is made. When a plurality of containers are required or desired, a similar image may be assembled for each of the plurality of containers, each image comprising the files required for the application to be run inside its associated container.

The computer network device 10 is configured for the management processor 36 to run a container which isolates the at least one port 125, 126 of the management processor 36 in communication with the switching circuitry 30. When so isolated, the at least one port 125, 126 is not accessible to processes running outside of the container, for example processes in communication with the externally accessible communication ports 123, 124. The at least one port is isolated.

The container is for running services not provided by the switching circuitry 30, examples of which may include, for example, the generation of layer 3 PDUs, BGP messages and PIM messages, which may satisfy exchange technical rules, for example.

The container when operational runs software that generates at least one of BGP messages, PIM messages and layer 3 PDUs. The container may run QUAGGA or a suitable alternative, for example, or an alternative thereof, for example BIRD, ExaBGP or FreeRangeRouting. When instructed by QUAGGA or the suitable alternative, the management processer sends BGP messages and/or PIM messages, and/or layer 3 PDUs via port 126 to the cross point switch 32 for sending thereof from the port 22.

The management processor may run a plurality of containers, including the container, and run different applications and/or processes in the plurality of containers.

The examples of computer networks 11,21 disclosed herein are packet switched networks in the form of packet switched local area networks, however they may be wide area computer networks, although the networks may be any suitable packet switched network. The disclosed embodiments use a network protocol in the 10 Gigabit Ethernet protocol family, however generally any suitable network protocol may be used, including but not limited to 1 Megabit Ethernet, 1 Gigbit Ethernet, 100 Gigabit Ethernet, FibreChannel, InfiniBand and PCIe. The transmission rate of a 10GE protocol is generally 10.3125 Gbit/s. The 10GE protocol family is now defined by standards published by the Institute of Electrical and Electronics Engineers (IEEE) 802.3 working group. Ten Gigabit Ethernet may sometimes be used to describe variations of the IEEE802.3 10GE protocols that are not approved by the 802.3 working group.

The IEEE 802.3 standards define the transmission of protocol data units (PDUs) including Ethernet frames and Ethernet packets over a network physical medium in the form of, for example, a network cable, backplane lane, or another suitable network medium that connects two nodes of the network. A network cable may be, for example:

An electrical network cable in the form of a twinaxial network cable, copper network cable, or twisted pair, for example, or an optical fibre network cable in the form of single mode or multimode optical fibre, for example.

A physical layer standard, for example as defined by IEEE 802.3, FibreChannel, InfiniBand and PCIe standards, define the electrical and/or optical connections and mechanical connections at the physical level. An Ethernet network node or device generally comprises a physical layer system (PHY) compliant with the IEEE 802.3 standard, and is in communication with a media access controller (MAC) of the data link layer, that defines a MAC address for the node or device, and which is responsible for the sending of a frame of data from one node of the network to another via the physical layer. The frame is a payload of an Ethernet packet defined at the physical layer. Each end of the network physical medium is connected to a physical layer interface of a respective node. The physical layer interface may comprise a medium attachment unit (MAU) in the form of at least one communications port of a respective node, which may comprise a transceiver, a receiver or a transmitter, and which may provide a mechanical connection and a communication connection between the node and the network physical layer medium. A transceiver may comprise a transceiver module in the form of, for example, a pluggable 10 GE Small Form Factor Pluggable transceiver (10 Gb/s SFP+), a XENPAK transceiver, a XFP transceiver, an embedded PHY receiver, or generally any suitable 10 GE transceiver. The transceiver may be received in a transceiver socket, the received transceiver being selected for the selected network physical medium. Embodiments may have a 10 GE receive PHY system and a 10 GE transmit PHY system.

Figure 3:
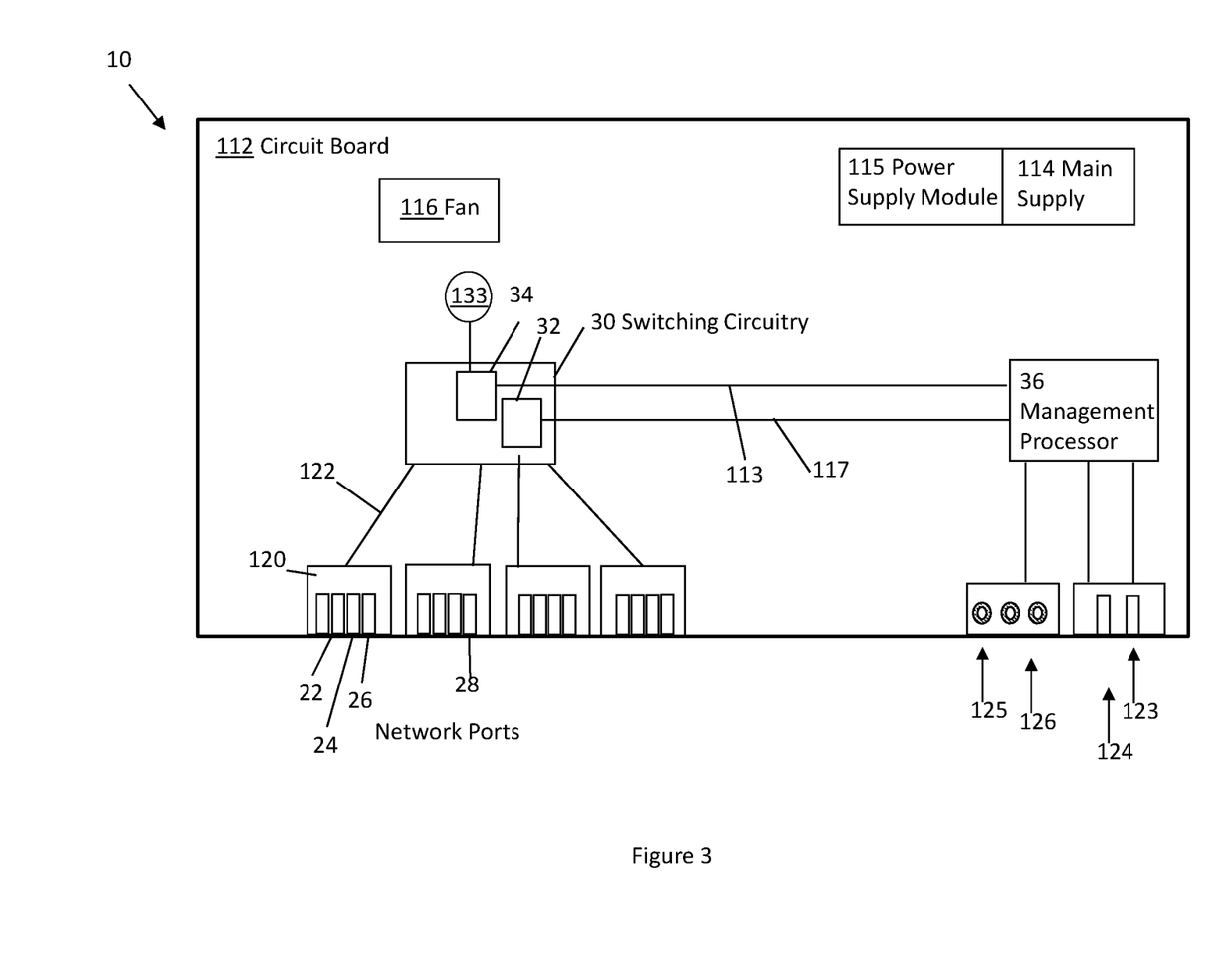
FIG. 3 shows an example architecture of the computer network device of FIG. 2.

FIG. 3 shows a schematic diagram of an example of an architecture of the computer network device 10. The computer network device 10 has a multilayer printed circuit board 112 having components mounted thereto which generally, but not necessarily, are connected to each other by conductive pathways, which may comprise, for example, tracks, signal traces, strip lines and/or micro strip lines, and wires, as appropriate. Generally, but not necessarily, the printed circuit board 112 is housed by a rack mountable enclosure having dimensions of 1 rack unit, although any suitable enclosure may be used or not used as desired. The printed circuit board 112 has various surface mounted and/or through hole components mounted thereto.

A mains supply 114 may be mounted to the printed circuit board 112, the mains supply in use producing a relatively low voltage, such as 12, 24 or 48 volts as suitable, from a relatively high voltage source, for example, a 110V or 240V electricity grid. There may be a DC regulator in the form of a switched mode power supply module 115 mounted to the printed circuit board 112 that receives the low voltage output from the mains supply 114 and powers two or more active conductive rails integral to the circuit board 112. Alternatively, the mains supply and DC regulator may be mounted within the enclosure separate from the printed circuit board 112.

At least one fan 116 may be mounted to the circuit board 112 or alternatively the enclosure. The at least one fan may provide airflow across the multilayer printed circuit board to extract waste heat.

The printed circuit board 112 has mounted thereto the management processor 36 comprising, in this but not necessarily all embodiments, a logic device in the form of an ARM processor communicating with serial, USB, or Ethernet interfaces 123, 124 for receiving instructions via an Ethernet (or other) management network or other source, for example. Ports 123 and 124 may be serial ports, USB ports, or generally any suitable port for receiving instructions. The management processor 36 may also control active indicia 127 in the form of LED status lights mounted at the front of the enclosure. In an alternative embodiment, the management processor may comprise a suitably configured field programmable array, an INTEL PENTIUM, or a system-on-a chip. Generally, any suitable logic device may be used. The management processor may be mounted on another circuit board, for example a mezzanine PCB.

The computer network device 10 has communication ports as described above, for example ports 22-28. In this embodiment, but not necessarily in all embodiments, the plurality of transceivers comprise Small Form Factor Pluggable Plus (SFP+) transceivers. The transceivers may be housed in enclosures in the form of SFP cages 120 fixed to the printed circuit board 112. The cages provide an electrical connection between electrical contacts on the transceivers and conductive tracks in the form of stripline and/or micro stripline tracks formed on or within the circuit board 112. The cages 120 may also act as Faraday cages to reduce electromagnetic interference, and extract heat from the transceiver. In alternative embodiments, the transceivers may be mounted directly to the printed circuit board.

The communication circuitry 30 is attached to with the PCB (i.e. the crosspoint swith 32 and FPGA 34 are mounted on the PCB, however components may be split between multiple PCBs.

The striplines 122 (which may be a micro-striplines, for example) provide a conduit for communications between the transceivers and the switching circuitry 30. In other embodiments, the FPGA 34 may be another type of logic device, and may be any suitable logic device such as a complex programmable logic device, and an application-specific integrated circuit (ASIC). In some embodiments, the switching circuitry 30 may comprise more than one logic device.

The FPGA 34 may have any suitable architecture. In one embodiment, the FPGA architecture comprises an array of configurable logic blocks, I/O heads or pins, and routing channels. Generally, but not necessarily, the logic blocks comprises logical cells that may comprise of, for example, a look up table, a full adder, and a D-type flip flop. Clock signals may be routed through special purpose dedicated clock networks within the FPGA 34 in communication with a reference clock 133 mounted on the printed circuit board 112. The FPGA 34 may also include higher-level functionality including embedded multipliers, generic digital signal processing blocks, embedded processors, high-speed I/O logic for communication with components external of the FPGA 34 (for example), and embedded memories that may be used by buffers.

The internal structure of the FPGA 34 is configured to form a plurality of modules. The modules are initially specified, for example, using a hardware description language, examples of which include HDL, VHDL and VERILOG. The functionality to be implemented in the FPGA 34 is described in a hardware description language. The description is compiled, synthesized and mapped to the FPGA 34 using appropriate EDA tools to a configuration file that, when loaded or programmed into the FPGA 34, causes the FPGA 34 to implement the functionality described.

Now that embodiments have been described, it will be appreciated that some embodiments may have some of the following advantages:

The externally accessible ports of the management processor may be isolated from the plurality of computer network ports, which may increase security.

Rules may be satisfied, for example exchange technical rules.

The computer network device may provide relatively low latency without compromising integrity.

Variations and/or modifications may be made to the embodiments described without departing from the spirit or ambit of the invention. The present embodiments are, therefore, to be considered in all respects as illustrative and not restrictive. Reference to a feature disclosed herein does not mean that all embodiments must include the feature.

Prior art, if any, described herein is not to be taken as an admission that the prior art forms part of the common general knowledge in any jurisdiction.

In the claims which follow and in the preceding description of the invention, except where the context requires otherwise due to express language or necessary implication, the word "comprise" or variations such as "comprises" or "comprising" is used in an inclusive sense, that is to specify the presence of the stated features but not to preclude the presence or addition of further features in various embodiments of the invention.

The invention claimed is:

1. A computer network device comprising:
a plurality of computer network ports for connecting to a plurality of computer network nodes;
switching circuitry that communicates each of a plurality of messages received by more than one of the plurality of computer network ports to at least one other computer network port for transmission;
a management processor comprising a plurality of management processor communication ports, wherein the plurality of management processor communication ports comprise at least one externally accessible communication port and at least one externally inaccessible communication port, wherein the at least one externally inaccessible communication port is a port that is not accessible from outside of the computer network device,
wherein the at least one externally inaccessible communication port is in communication with the switching circuitry,
wherein the management processor sends switching circuitry configuration instructions via the at least one externally inaccessible communication port to configure the switching circuitry, and
wherein the management processor runs a container isolating the at least one externally inaccessible communication port such that the at least one externally inaccessible port is not accessible by a computer process running within the management processor, and the computer process is accessible outside of the container.

2. The computer network device defined by claim 1, wherein the at least one externally accessible communication port receives configuration instructions that instruct the management processor to send the switching circuitry configuration instructions.

3. The computer network device defined by claim 1, wherein the management processor runs at least one computer networking process within the container.

4. The computer network device defined by claim 3, wherein the at least one computer networking process sends, via the at least one externally inaccessible port, a plurality of network control messages for transmission by the at least one other computer network port.

5. The computer network device defined by claim 4, wherein the plurality of network control messages comprises:
   at least one of a plurality of layer 3 protocol data units (PDUs),
   a plurality of border gateway protocol (BGP) control messages, and
   a plurality of protocol independent multicast (PIM) messages.

6. The computer network device defined by claim 3, wherein the computer networking process comprises:
   at least one of a QUAGGA process, and
   a process having a QUAGGA process functionality.

7. The computer network device defined by claim 1, wherein the management processor is external of the switching circuitry.

8. The computer network device of claim 1, wherein the switching circuitry comprises a crosspoint switch.

9. The computer network device defined by claim 8, wherein the crosspoint switch is in intermediate communication with the plurality of computer network ports and the at least one other computer network port.

10. The computer network device defined by claim 8, wherein the switching circuitry comprises a logic device in communication with the crosspoint switch.

11. The computer network device defined by claim 10, wherein the logic device comprises a field programmable gate array (FPGA).

12. The computer network device defined by claim 1, wherein the switching circuitry does not generate at least one of: a layer 3 protocol data units (PDU), a border gateway protocol (BGP) message, and a protocol independent multicast (PIM) message.

13. The computer network device defined by claim 1, further comprising:
   a plurality of computer network nodes in communication with the plurality of computer network ports of the computer network device; and
   a computer network router in intermediate communication with the at least one other computer network port of the computer network device and a matching engine that is a node of an electronic market computer network.

14. The computer network of claim 13, wherein the plurality of computer network nodes are configured to generate financial instrument orders for the matching engine.

15. The computer network of claim 13, wherein the computer network device, when operational, generates at least one of a border gateway protocol (BGP) message and protocol independent multicast (PIM) message.

16. A method for computer networking comprising:
   instructing a management processor of a computer network device to run a container that isolates at least one externally inaccessible communications port of the management processor that is in communication with switching circuitry of the computer network device, wherein the at least one externally inaccessible communications port is a port that is not accessible from outside of the computer network device,
   wherein the at least one externally inaccessible communications port is not accessible by a computer process running within the management processor, and the computer process is accessible outside of the container;
   sending, by the management processor via the at least one externally inaccessible communications port, switching circuitry configuration instructions to configure the switching circuitry; and
   communicating, by the switching circuitry, each of a plurality of messages from a plurality of computer network ports of the computer network device to at least one other computer network port for transmission.

17. The method of claim 16, further comprising:
   running, within the container, a computer networking process that sends, via the at least one externally inaccessible communication port, switching circuitry network control messages for transmission by the at least one computer network port.

18. The method of claim 17, wherein the network control messages comprise:
   at least one of a plurality of layer 3 protocol data units (PDUs),
   a plurality of border gateway protocol (BGP) control messages, and
   a plurality of protocol independent multicast (PIM) messages.

19. The method of claim 17, wherein the computer networking process comprises:
   at least one of a QUAGGA process, and
   a process having a QUAGGA process functionality.

20. A non-transitory computer readable medium comprising computer readable program code, which when executed by a computer processor, enables the computer processor to:
   instruct a management processor of a computer network device to run a container that isolates at least one externally inaccessible communications port of the management processor that is in communication with switching circuitry of the computer network device, wherein the at least one externally inaccessible communications port is a port that is not accessible from outside of the computer network device,
   wherein that the at least one externally inaccessible communications port is not accessible by a computer process running within the management processor, and the computer process is accessible outside of the container;
   send, by the management processor via the at least one externally inaccessible communications port, switching circuitry configuration instructions to configure the switching circuitry; and
   communicate, by the switching circuitry, each of a plurality of messages from a plurality of computer network ports of the computer network device to at least one other computer network port for transmission.

* * * * *